United States Patent [19]

Kisa

[11] Patent Number: 4,738,748
[45] Date of Patent: Apr. 19, 1988

[54] PLASMA PROCESSOR AND METHOD FOR IC FABRICATION

[75] Inventor: Toshimasa Kisa, Kawasaki, Japan

[73] Assignee: Fujitsu Limited, Kawasaki, Japan

[21] Appl. No.: 654,939

[22] Filed: Sep. 27, 1984

[30] Foreign Application Priority Data

Sep. 30, 1983 [JP] Japan .................................. 58-182009

[51] Int. Cl.$^4$ ........................................... H01L 21/306
[52] U.S. Cl. ..................................... 156/643; 156/345; 156/646; 204/192.32; 204/298; 406/88
[58] Field of Search ............... 156/345, 643, 640, 646; 204/192.32, 298; 269/21; 406/88, 92; 198/592

[56] References Cited

U.S. PATENT DOCUMENTS

| | | | |
|---|---|---|---|
| 3,645,581 | 2/1972 | Lasch, Jr. et al. | 406/88 X |
| 4,160,690 | 7/1979 | Shibagaki et al. | 204/192 E X |
| 4,348,139 | 9/1982 | Hassan et al. | 406/88 X |
| 4,380,488 | 4/1983 | Reichelderfer et al. | 156/345 X |
| 4,392,915 | 7/1983 | Zajac | 156/345 X |
| 4,411,733 | 10/1983 | MacKlin et al. | 204/298 X |
| 4,412,906 | 11/1983 | Sato et al. | 204/298 |
| 4,575,408 | 3/1986 | Bok | 156/643 X |
| 4,594,129 | 6/1986 | Bok | 156/345 X |

FOREIGN PATENT DOCUMENTS

| | | | |
|---|---|---|---|
| 54-20584 | 2/1979 | Japan | 406/88 |
| 54-20586 | 2/1979 | Japan | 406/88 |
| 57-40931 | 3/1982 | Japan | 156/345 |
| 58-207217 | 12/1983 | Japan | 406/88 |

OTHER PUBLICATIONS

Antoci et al., "Spray Etch Apparatus", IBM Technical Disclosure Bulletin, vol. 14, No. 9, Feb. 1979, pp. 2605-2606.
Garnache et al., "Deposit and Clean Deposition System", IBM Technical Disclosure Bulletin, vol. 13, No. 7, Dec. 1970, p. 2083.

Primary Examiner—Donald E. Czaja
Assistant Examiner—Ramon R. Hoch
Attorney, Agent, or Firm—Staas & Halsey

[57] ABSTRACT

A plasma processor, for dry etching during a fabricating process for an integrated circuit semiconductor device, including a plasma generating region formed in a waveguide into which microwave power is transmitted. An etchant gas is introduced into the plasma generating region and a plasma is generated. The plasma generating region and a reacting region are kept at a specific gas pressure differential by an evacuating device. The radicals (active etching species) react with the underside of a turned wafer placed on a base plate in the reacting region because the gas is blown against the underside of the wafer by the pressure differential. In particular, the wafer is etched by etchant gases floating the wafer by blowing the gases out of holes in the base plate. The floating wafer processing method provides a higher processing rate and better etching uniformity.

19 Claims, 3 Drawing Sheets

PLASMA PROCESSOR AND METHOD FOR IC FABRICATION

BACKGROUND OF THE INVENTION

The present invention relates to a wafer processing method and apparatus used for the fabrication of an integrated circuit (IC) semiconductor, more particularly, the present invention relates to a plasma processor and method having an improved processing rate and which is used for etching during IC fabrication.

Since the beginning of the IC industry, a wet etching method has been employed utilizing sulphuric acid, hydrochloric acid or phosphoric acid, however, recently the wet etching method has been replaced by a dry etching method, such as a plasma etching method. A plasma etching process has various advantages in comparison with the wet etching method, such as higher resolution, less undercutting, inherent cleanness, and a reduction in the number of fabricating processes, such as elimination of wafer rinsing and drying. Plasma etching, according to the present invention, in particular, makes it possible to perform sequential etching and stripping operations on the same machine, making it possible to realize fully automated IC fabrication.

A plasma is a highly ionized gas having a nearly equal number of positively and negatively charged particles and free radicals. The free radicals generated in plasma, act as a reactive species, chemically combine with materials to be etched, and form volatile compounds which are removed from the wafers by a vacuum.

During a process for forming fine patterns in the IC device, an etching process is performed, and in particular, the etching process includes both a true etching process and an "ashing" process which may be defined as a process for removing a photoresist mask which is usually an organic layer. The true etching process etches off the protective layers of silicon, silicon dioxide, etc. When ashing, oxygen ($O_2$) is usually used as an etchant gas, and when etching a gas mixture of carbon-tetrafluoride ($CF_4$) or carbon-tetrachloride ($CCl_4$), etc. are used at a specified temperature and pressure.

Plasma processors can be classified into two types. In the first type a plasma is generated in a plasma generator and the activated plasma gas is introduced to the wafers in a separate location. In the second type, the wafers are placed in the plasma generating area. The first method is very slow and results in a wafer surface which is not uniform. The second method damages the wafer in the plasma environment due to bombardment by ions, ultraviolet rays, and soft X-rays, and, in addition, the wafer is contaminated with impurities from the plasma gas, resulting in widely varying quality of the wafer surfaces.

SUMMARY OF THE INVENTION

It is an object of the present invention, therefore, to provide a plasma processing method and processor having a high processing rate and providing a uniform wafer surface after the etching process.

It is another object of the present invention to provide an etching process that can be completely automated.

It is an additional object of the present invention to improve the safety of the etching process for an operator.

It is a further object of the present invention to improve the quality of etched wafers.

A plasma processor in accordance with the present invention comprises an airtight chamber having a plurality of holes arranged in a base plate of a wafer processing space through which an activated plasma gas is introduced. The wafer is placed on the base plate with the surface to be etched facing downward. The wafer is processed by the activated etchant gases which are blown out of the holes in the base plate. The wafer is floated and rotated by jet streams of the etchant gas issuing from the holes while the wafer is being etched. Therefore, the wafer can be etched uniformly at a high processing rate without being affected by ion bombardment, ultraviolet radiation or soft X-rays, resulting in the reliability and yield of the wafer production process being improved.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
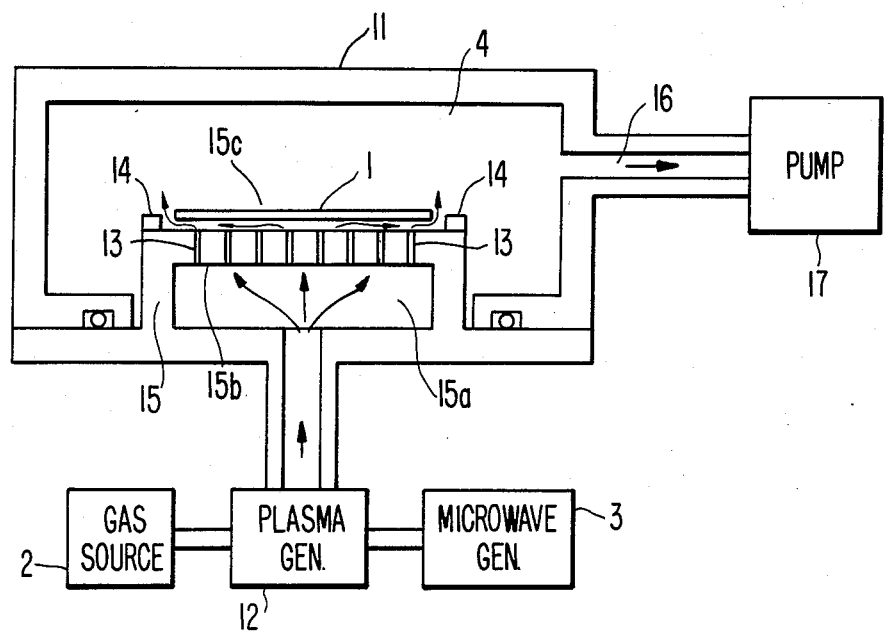
FIG. 1 illustrates the principle of a plasma processing method according to the present invention.

FIG. 1 shows schematically the principle of a plasma processing method according to the present invention. The plasma processor comprises a plasma generating region 12, which is separated from a reacting region 4 (reactor) in an airtight reaction chamber 11, and a pumping device 17. A wafer 1 is placed on a base plate 15 with the surface to be etched facing downward. Air in the reaction chamber 11 is exhausted by the pumping device 17, and the etchant gas is supplied from an etchant gas source 2 into the reacting region 4. When microwave energy 7 generated by a microwave generator 3 is transmitted into the plasma generating region 12, the gas is ionized. Radicals with chemically active species are generated in the plasma generating region 12 and fed into a cavity 15a. The activated etchant gas rushes out of holes 13 into the reacting region 4, forming etchant gas jet streams. The wafer 1 is floated above the top of the base plate 15c by the etchant gas jet stream, and at the same time, the wafer is etched. That is, the radicals reaching the surface of the wafer 1 act on the material of the wafer 1 forming volatile compounds. The compounds and etchant gases are removed by the pumping device 17 through an exhaust tube 16.

Oxygen ($O_2$) plasma gas, for example, is generated in the plasma generating region 12 by microwave energy at a frequency of 2.45 GHz and introduced into the cavity 15a, arranged inside of the base plate 15. The oxygen plasma gas is blown out of the gas holes 13, each of which is a fine nozzle. Pressure in the reacting region 4 in the reaction chamber 11 is maintained at about 1 Torr and the pressure of the cavity 15a is maintained at about 2-3 Torr resulting in a pressure differential between reacting region 4 and cavity 15a causing the jet streams to issue from holes 13. The radicals of the etchant gas are pressed into the space between the wafer 1 and the surface of base plate 15 and the wafer 1 floats. The gas flows out, as shown by an arrow in the figure, through a space between the wafer 1 and a guide 14. While the wafer 1 floats at a height of 0.1-1.0 mm, it is protected from drifting off the base plate 15 by the guide 14. The flat uniform stream of etchant gas between the floating wafer 1 and the base plate 15 etches the wafer 1 uniformly at a high rate as compared to the conventional etching method. The gases used for processing are also saved, in comparison with a conventional plasma etching processor, by exhausting through the exhaust tube 16 using the pumping device 17.

Figure 2A:
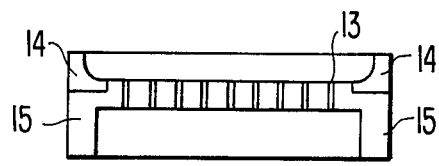
FIG. 2(a) is a side view of the base plate using the principle of plasma processing according to the present invention and FIG. 2(b) is a top view.
Figure 2B:
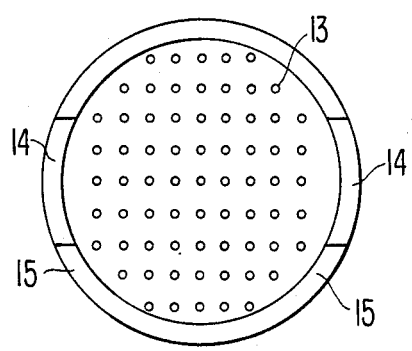

FIG. 2(a) is a side view and FIG. 2(b) is a top view of the top of the base plate of the present invention. A plurality of gas holes 13 can be arranged about 10 mm apart. The gas holes can be from 0.5 mm to 2.5 mm in diameter depending on the desired volume of gas outflow which can be used to control the etching rate. The axis of the holes are vertical to the surface of the base plate and the base plate 15 is made of aluminum or titanium.

Figure 3:
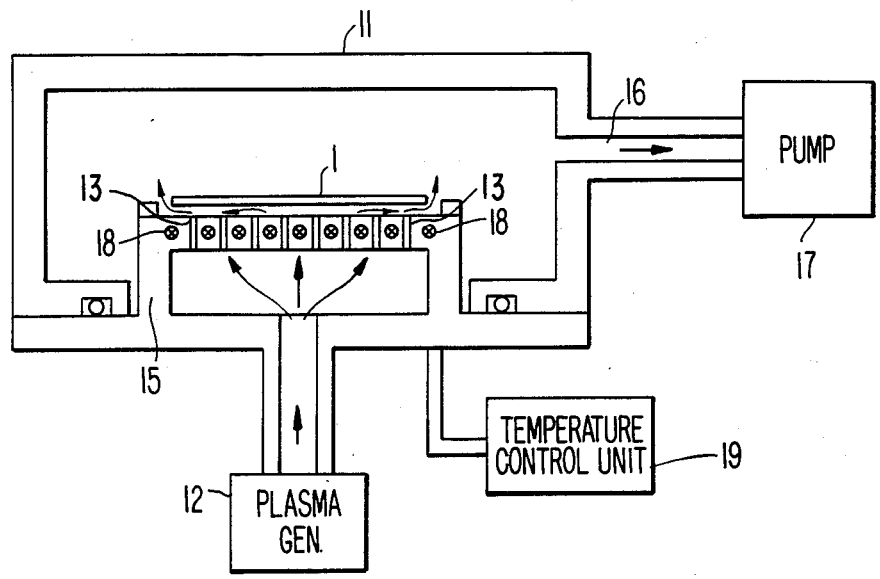
FIG. 3 is a side view, partially in cross-section, of a base plate having heaters, according to another principle of the plasma processing method of the present invention.

FIG. 3 illustrates another plasma processing method according to the present invention. The difference between the base plate of FIG. 3 and that of FIG. 1 is that heater elements 18 and a temperature control unit 19 are additionally provided During plasma processing, the etchant gas in the holes 13 is heated by the heating elements 18 and, as a result, the wafer 1 is heated to a proper processing temperature by the etchant gases. The processing temperature is controlled by the temperature control unit 19. When the wafer is heated up, it is possible to perform the etching process at a higher rate. It is preferable that the operating temperature of the wafer during etching be about 150° C. to obtain a high processing rate.

Figure 4:
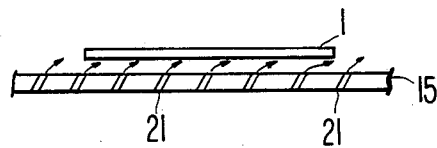
FIG. 4 is a side view, partially in cross-section, of the base plate holes, of still another principle used in the plasma processing method according to the present invention.

FIG. 4 is a side view, partially in cross-section of the gas holes, of still another principle of a plasma processing method according to the present invention. The difference between the construction of the holes 21 of FIG. 4 and those of FIG. 1 is that the base plate holes 21 are arranged in the base plate 15, with their axes inclined with respect to the surface of the base plate 15 at an angle of inclination from 30 to 60 degrees. The etchant gas flows as shown by an arrow in FIG. 4 and the wafer 1 is moved to the right. As a result, the wafer 1 is etched by the etchant gas and, at the same time, the wafer is transported by the etchant gas in a manner similar to the way an air-bearing transports a wafer which is a widely used method of transfer in wafer handling systems. The system of FIG. 4 can be utilized as a plasma processing system and a wafer transfer system at the same time. It is also possible to switch from a plasma processor to an air-bearing system by merely switching the gas issuing from the holes.

Figure 5:
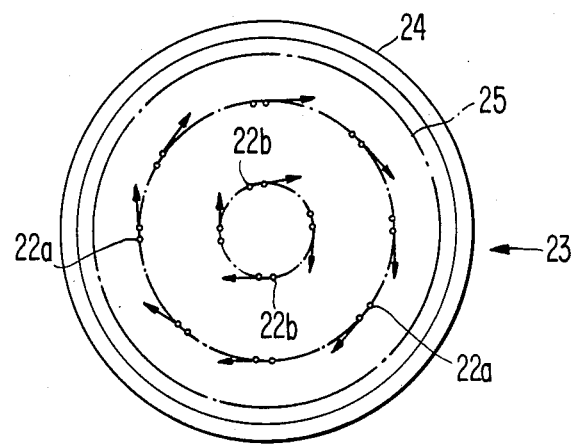
FIG. 5 is a plan view of the base plate of still another principle used in the plasma processing method according to the present invention.

FIG. 5 is a plan view of the base plate of still another principle of a plasma processing method according to the present invention. The difference between the base plate of FIG. 5 and FIG. 1 is that the gas holes 22 are arranged to rotate the wafer. The gas holes 22 are positioned on concentric circles around the center of the base plate 23 and each hole slants with respect to the surface of the base plate 23 about 45 degrees, for example, in a tangential direction to the circle. In a preferred embodiment of FIG. 5, the holes 22 are arranged at regular intervals on two concentric circles 22a and 22b around the center of the base plate 23, and gas jets flow from the holes, float the wafer and rotate it at a desired speed during plasma processing. The application of such rotational processing, increases the uniformity of the processed wafer even further than previously discussed methods.

The heater 18 and the temperature control unit 19 are also applicable to the embodiments of FIGS. 4 and 5 and further raise the processing speed. The application of the heater 18 to FIGS. 4 and 5 will be easily understood by one of ordinary skill in the art, and for the sake of simplicity, the explanation thereof has been omitted.

Figure 6:
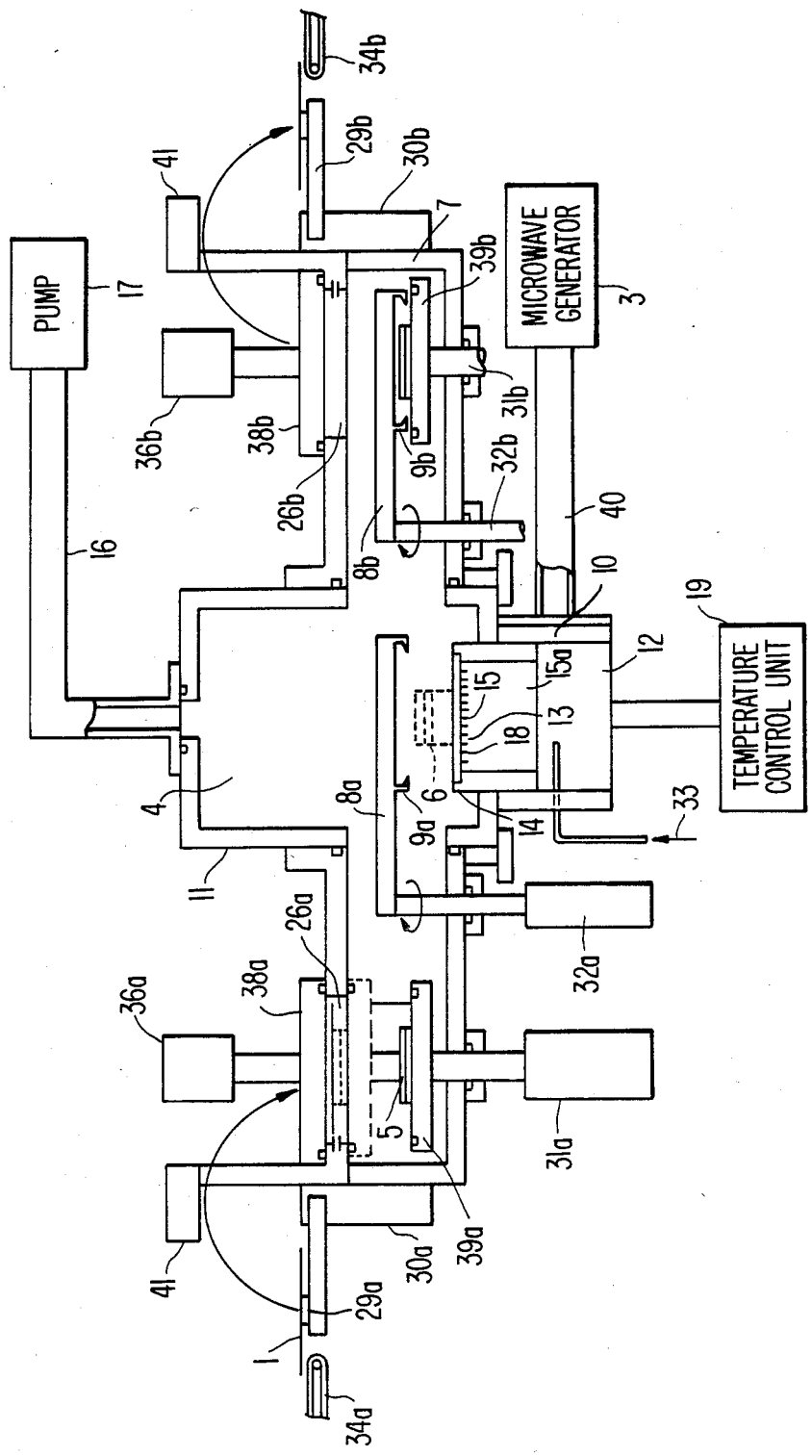
FIG. 6 is a schematic diagram of a plasma processor system including the present invention.

FIG. 6 is a schematic diagram of a plasma processor system embodying the present invention and results in a totally automated operation which does not require manual handling of wafers or wafer trays. Wafer loading is accomplished through vacuum load lock spaces 26a and 26b, so that the reaction chamber 11 is maintained at a specified gas pressure and is not exposed to the ambient environment. The load lock space 26a comprises an airtight space between an entrance gate valve 38a and a slit gate valve 39a. The slit gate valve 39a is used for communicating between the load lock space 26a and the reaction chamber 11. The entire process sequence is microprocessor controlled through a control module (not shown).

During operation of the system of FIG. 6, a wafer 1 is transported on polyurethane belt 34a and the wafer moves into position over the vacuum chucks 29a. Before the entrance gate valve 38a is opened, a slit gate valve 39a is lifted up by an up and down mechanism 31a and pressed against the upper wall of the reaction chamber 11. The space surrounded by the entrance gate valve 38a, the slit gate valve 39a and the wall of the reaction chamber 11 provides the airtight load lock space 26a. The gas in the load lock space 26a is evacuated and replaced by air through a pressurizing system 41, and the replacement is accomplished very quickly, since the volume of the load lock space 26a is very small (for example, 5 mm high and 15 cm in diameter).

The entrance gate valve 38a is then pulled up by an open and close mechanism 36a. The wafer 1 is chucked by a vacuum chuck 29a, and turned over by the reversing mechanism 30a, and placed on a stage 5. The entrance gate valve 38a is again closed by the open and close mechanism 36a. Air in the load lock space is replaced by gas from the reaction chamber 11 and the slit gate valve 39a is pulled down by the up and down mechanism 31a. In this way, the wafer is taken into the reaction chamber 11, without disturbing the condition of the reaction chamber 11. As a result, plasma processing can continue while a wafer is being in or taken out. Next, the wafer is chucked by a chuck 9a on an arm 8a which is rotated by a rotation mechanism 32a. The wafer 1 is transferred onto the stage 6 (shown as a dotted line) in the base plate 15. The wafer is then lowered onto the base plate 15, and can now be etched using the floating wafer processing method of the present invention.

Oxygen (O₂) plasma gas, for example, is generated in a plasma generating region 12, by microwave energy at a frequency of 2.45 GHz and introduced into a cavity 15a through an isolator 10. The isolator 10 is a dielectric window formed in a waveguide 40 for defining a portion of the plasma generating region 12, the dielectric window transmits the microwave radiation therethrough. Oxygen plasma gas is blown out of the gas holes 13 in the base plate 15, which are provided with heater elements 18 and a temperature control unit 19. Pressure in the reacting region 4 in the reaction chamber 11 is maintained at about 1 Torr, the pressure in the cavity 15a is maintained at about 2-3 Torr and the gas is blown out by the differential between these pressures. The radicals of the etching gas are pressed into the space between the wafer and the top surface of the base plate 15 and the wafer floats due to the pressure of the gas. The gas flows from a space between the wafer 1 and the guide 14. The floating wafer height is controlled by the gas pressure at 0.1-1.0 mm and the wafer 1 is kept from drifting off the base plate 15 by guide 14. The flat uniform stream of the etchant gas between the wafer and the base plate 15 etches the wafer uniformly at a high processing rate. The gases used for the processing are saved by exhausting the compounded gases through the exhaust tube 16 and the pumping device 17.

The wafer to be unloaded is chucked by rotation mechanism 32b, and moved to stage 7 on the slit gate valve 39b. Next, by using the up and down mechanism 31b, the wafer is moved up into the load lock space 26b. Then, the wafer is closed in the load lock space 26b, and the gas in the load lock space 26b is evacuated and replaced by air through the pressurizing system 41. The load lock valve 38b is opened, by an open and close mechanism 36b, the wafer of the stage 7 is chucked, and turned over by the reversing mechanism 30b. The unloaded wafer is loaded onto a return belt 34b and the load lock space 26b is filled with gas from the reaction chamber 11. The processed wafer is transported to a receiver cassette (not shown) and the cycle of the processor is completed.

In the plasma processor of FIG. 6, the reacting region 4 must be airtight, since the etchant gas is dangerous to the operator and should not be contaminated by moisture or dust from the environment. Therefore, packing or O-rings are provided around the moving shafts or gate valves 38a, 38b and 39a, 39b and the gas in the reaction chamber 11 is kept at a specific pressure by the pumping system 17. For example, the pressure of an etchant gas of carbon-tetrafluoride (CF₄) or carbon-tetrachloride (CCl₄) in the reacting region 4 of the reacting chamber 11 is kept at about 0.3 Torr.

The load lock processing provides several benefits in that it isolates the reaction chamber from the atmosphere and provides for thermal as well as pressure and gas flow stability. It also reduces the air and moisture content in the chamber which improves both etching reproducibility and process uniformity. The load lock operation also provides increased safety so that the operators are no longer exposed to the etchant gases used during plasma processing.

The system can be operated in a continuous processing mode, that is, while one wafer is in process, another wafer can be taken in or taken out of the reaction chamber so that productivity is increased. The throughput of the system of FIG. 6 in the continuous mode is 60 percent higher than in the standard operating mode (which is similar to a manual system). Etching uniformity is enhanced by the rotating process system and the etching rate is increased up to about 6 μm/min., which is almost twice as fast as that of a conventional plasma processor system.

As described above, according to the plasma processor of the present invention, the etching process is performed at a higher speed and etching uniformity is increased as compared to a conventional plasma processor.

The many features and advantages of the invention are apparent from the detailed specification and, thus, it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, and, accordingly, all suitable modifications and equivalents may be resorted to, falling within the scope of the invention.

I claim:

1. A processing method for etching, in an etching chamber, a wafer with a top surface and having a bottom surface to be etched comprising floating the wafer in the etching chamber on a plasma activated echant gas activated outside the eching chamber by creating a pressure differential between the top and bottom surface of the wafer and blowing the activated etchant gas against the bottom of the wafer, and etching the bottom with the activated etchant gas used for floating the wafer.

2. A processing method for etching a wafer, comprising the steps of:
   (a) placing the wafer in an etching chamber on a stage having holes therein, the wafer having a surface to be etched on the bottom;
   (b) providing an activated etchant gas under the stage, the etchant gas activated outside the etching chamber; and
   (c) creating a pressure differential between the etchant gas and the top of the wafer causing the etchant gas to pass through the holes, the etchant gas passing through the holes both floating the wafer and etching the bottom of the wafer.

3. A processing method for performing an etching process in an etching chamber on a wafer having a substrate, comprising the steps of:
   (a) placing the wafer at a processing position in the etching chamber with a surface to be etched on the bottom;
   (b) creating a plasma activated etchant gas outside the etching chamber; and
   (c) blowing the activated etchant gas against the bottom of the wafer, the blown activated etchant gas both floating the wafer and etching the bottom of the wafer.

4. A wafer processing method as recited in claim 3, wherein the etchant gas is heated to a specified temperature before being blown against the bottom of the wafer.

5. A wafer processing method as recited in claim 3, wherein the etchant gas is blown at the bottom and at an angle less than ninety degrees with respect to the bottom of the wafer and sufficient to move the wafer.

6. A wafer processing method as recited in claim 5, wherein the wafer is rotated.

7. A wafer processing method as recited in claim 5, wherein the wafer is translated horizontally.

8. An etching method for processing a substrate having a surface to be processed on the bottom, comprising the steps of:
   (a) placing the substrate in an etching chamber on a base plate having holes, with the surface of the substrate to be processed against the base plate;
   (b) blowing a plasma activated etchant gas from a plasma generating chamber through the holes and against the bottom of the substrate; and
   (c) floating the substrate with a force of the blown etchant gas and etching the bottom of the substrate at the same time with the blown etchant gas.

9. An etching method as recited in claim 8, wherein step (c) includes rotating the substrate while the substrate floats.

10. An etching method as recited in claim 8, wherein step (c) includes transferring the substrate horizontally while the substrate floats.

11. An etching processor for etching a substrate having a surface to be etched on the bottom, said processor comprising:
   a plasma generator generating a pressurized plasma activated etchant gas;
   an airtight vacuum pressurized reaction chamber having a vacuum created therein and in which the substrate is processed;
   a base plate at the bottom of said reaction chamber having holes for the plasma activated etchant gas to blow against the bottom of the substrate; and
   a gas chamber below said base plate and coupled to said generator to receive the pressurized gas, an upper wall of said gas chamber being the bottom of said base plate and a pressure being maintained in said gas chamber sufficient to create a blowing force of the etchant gas against the substrate floating the substrate while substrate is etched by the etchant gas.

12. A processor as recited in claim 11, wherein the holes are angled to rotate the substrate while the substrate floats during etching.

13. A processor as recited in claim 11, wherein the holes are angled to transfer the substrate horizontally while the substrate floats during etching.

14. A wafer processor for processing a wafer having a surface to be etched on the bottom, comprising:
   a gas generator for creating a pressurized plasma activated etchant gas;
   an airtight reaction chamber in which the wafer is processed and having a first pressure therein, and said reaction chamber including a base plate having holes on which the wafer is positioned with the bottom surface of the wafer to be processed facing said base plate; and
   a gas supply chamber beneath said base plate coupled to said gas generator and receiving the gas, the upper wall of said chamber being the bottom of said base plate and the gas in said supply chamber having a second pressure higher than the first pressure, thereby blowing the activated etchant gas through the holes, the activated etchant gas blowing through the holes both floating the wafer and etching the bottom of the wafer.

15. A wafer processor as recited in claim 14, wherein the holes are slanted with respect to said base plate in a specified direction, the wafer is transferred in the specified direction by the etchant gas blown from the holes and, at the same time, the wafer is etched.

16. A wafer processor as recited in claim 14, wherein the holes are provided along a circle around the center of the base plate and slanted with respect to said base plate in a specified direction around the circle, and the wafer is rotated in the specified direction by the etchant gas blowing from the holes and, at the same time, the wafer is etched.

17. A wafer processor as recited in claim 14, wherein said plasma generator comprises:
   heating means for heating the etchant gas; and
   temperature control means for controlling said heating means to keep the etchant gas temperature at a specified temperature.

18. A wafer processor as recited in claim 17, said plasma generator further comprising:
   an etchant gas source for providing the etchant gas;
   a plasma generating region for generating a plasma of the etchant gas from said gas source to create a plasma activated etchant gas; and
   a microwave generator for supplying microwave radiation to the plasma generating region; and
   said processor further comprising a pumping device for exhausting the gas from said airtight reaction chamber to keep said airtight reaction chamber at the first pressure.

19. A wafer processor according to claim 18, further comprising:
   a conveyor belt;
   an airtight load lock space formed between an entrance gate valve and a slit gate valve, the entrance gate value and slit gate valve providing communication to said airtight reaction chamber via said airtight load lock space and having a stage;
   a pressure preparing system for evacuating said airtight load lock space and refilling the gases from and at the same pressure as that space to which said airtight load lock space is connected;
   a reversing mechanism for one of picking up said wafer from the conveyor belt, turning it over and placing it on the stage of the slit gate valve through the entrance gate valve, and picking up said wafer from the stage of the slit gate valve through said entrance gate valve, turning it over and placing it on the conveyor belt;
   an open and close mechanism for opening and closing the entrance gate valve;
   an up and down mechanism for moving the slit gate valve to open or close said airtight load lock space; and
   a rotation mechanism having a chuck on an arm for picking up the wafer, rotating the arm and transferring the wafer from the stage of the slit gate valve to said base plate of said reaction chamber or vice versa.

* * * * *

UNITED STATES PATENT AND TRADEMARK OFFICE
CERTIFICATE OF CORRECTION

PATENT NO. : 4,738,748

DATED : April 19, 1988

INVENTOR(S) : TOSHIMASA KISA

It is certified that error appears in the above-identified patent and that said Letters Patent is hereby corrected as shown below:

Column 4, line 63, before "in" should be --placed--.

Column 6, line 28, "eching" should be --etching--;
line 30, "face" should be --faces--.

Signed and Sealed this

Fourth Day of October, 1988

Attest:

DONALD J. QUIGG

Attesting Officer

Commissioner of Patents and Trademarks